(12) United States Patent
Derderian et al.

(10) Patent No.: US 6,969,677 B2
(45) Date of Patent: Nov. 29, 2005

(54) METHODS OF FORMING CONDUCTIVE METAL SILICIDES BY REACTION OF METAL WITH SILICON

(75) Inventors: Garo J. Derderian, Boise, ID (US); Cem Basceri, Reston, VA (US)

(73) Assignee: Micron Technology, Inc., Boise, ID (US)

(*) Notice: Subject to any disclaimer, the term of this patent is extended or adjusted under 35 U.S.C. 154(b) by 92 days.

(21) Appl. No.: 10/690,029

(22) Filed: Oct. 20, 2003

(65) Prior Publication Data
US 2005/0085058 A1    Apr. 21, 2005

(51) Int. Cl.[7] .............................................. H01L 21/44
(52) U.S. Cl. ...................... 438/655; 438/664; 438/682
(58) Field of Search .............................. 438/630, 651, 438/664, 682, 922, 923, 627, 643, 649, 653, 438/655

(56) References Cited

U.S. PATENT DOCUMENTS

| | | |
|---|---|---|
| 3,349,474 A | 10/1967 | Rauscher |
| 4,086,074 A | 4/1978 | Minot et al. |
| 4,622,735 A | 11/1986 | Shibata |
| 4,683,645 A | 8/1987 | Naguib et al. |
| 4,693,910 A | 9/1987 | Nakajima et al. |
| 4,766,090 A | 8/1988 | Coquin et al. |
| 5,099,304 A | 3/1992 | Takemura et al. |
| 5,236,865 A | 8/1993 | Sandhu et al. |
| 5,406,123 A * | 4/1995 | Narayan ...................... 257/767 |
| 5,444,024 A | 8/1995 | Anjum et al. |
| 5,470,784 A | 11/1995 | Coleman |
| 5,470,794 A | 11/1995 | Anjum ........................ 437/200 |
| 5,670,298 A | 9/1997 | Hur |
| 5,904,517 A | 5/1999 | Gardner et al. ............. 438/197 |
| 5,955,244 A | 9/1999 | Duval |
| 5,998,264 A | 12/1999 | Wu .............................. 438/260 |
| 6,037,239 A | 3/2000 | Jennings |
| 6,096,621 A | 8/2000 | Jennings |
| 6,130,140 A | 10/2000 | Gonzalez |
| 6,133,105 A | 10/2000 | Chen et al. |

(Continued)

FOREIGN PATENT DOCUMENTS
EP        0 851 473 A2    1/1998

OTHER PUBLICATIONS
U.S. Appl. No. 10/932,218, filed Sep. 1, 2004, Basceri et al.

(Continued)

Primary Examiner—David Nelms
Assistant Examiner—Quoc Hoang
(74) Attorney, Agent, or Firm—Wells St. John P.S.

(57) ABSTRACT

The invention includes methods of forming conductive metal silicides by reaction of metal with silicon. In one implementation, such a method includes providing a semiconductor substrate comprising an exposed elemental silicon containing surface. At least one of a crystalline form TiN, WN, elemental form W, or SiC comprising layer is deposited onto the exposed elemental silicon containing surface to a thickness no greater than 50 Angstroms. Such layer is exposed to plasma and a conductive reaction layer including at least one of an elemental metal or metal rich silicide is deposited onto the plasma exposed layer. At least one of metal of the conductive reaction layer or elemental silicon of the substrate is diffused along columnar grain boundaries of the crystalline form layer effective to cause a reaction of metal of the conductive reaction layer with elemental silicon of the substrate to form a conductive metal silicide comprising contact region electrically connecting the conductive reaction layer with the substrate. Other aspects and implementations are contemplated.

68 Claims, 3 Drawing Sheets

U.S. PATENT DOCUMENTS

| | | | |
|---|---|---|---|
| 6,133,116 A | 10/2000 | Kim et al. | |
| 6,156,674 A | 12/2000 | Li et al. | |
| 6,165,834 A | 12/2000 | Agarwal et al. | |
| 6,177,235 B1 | 1/2001 | Francou et al. | |
| 6,180,465 B1 | 1/2001 | Gardner et al. | 438/291 |
| 6,188,097 B1 | 2/2001 | Derderian et al. | |
| 6,207,485 B1 | 3/2001 | Gardner et al. | 438/216 |
| 6,238,994 B1 | 5/2001 | Derderian et al. | |
| 6,277,709 B1 | 8/2001 | Wang et al. | |
| 6,277,728 B1 | 8/2001 | Ahn et al. | |
| 6,281,100 B1 | 8/2001 | Yin et al. | |
| 6,291,363 B1 | 9/2001 | Yin et al. | |
| 6,297,527 B1 | 10/2001 | Agarwal et al. | |
| 6,350,560 B1 | 2/2002 | Sahbari | |
| 6,380,611 B1 | 4/2002 | Yin et al. | |
| 6,383,723 B1 | 5/2002 | Iyer et al. | |
| 6,399,982 B1 | 6/2002 | Derderian et al. | |
| 6,440,793 B1 | 8/2002 | Divakaruni et al. | |
| 6,465,325 B2 | 10/2002 | Ridley et al. | |
| 6,511,896 B2 | 1/2003 | Basceri et al. | |
| 6,548,854 B1 | 4/2003 | Kizilyalli et al. | 257/310 |
| 6,608,343 B2 | 8/2003 | Derderian et al. | |
| 6,617,250 B2 | 9/2003 | Basceri et al. | |
| 6,649,466 B2 | 11/2003 | Basceri et al. | |
| 6,720,638 B2 | 4/2004 | Tran | |
| 6,744,093 B2 | 6/2004 | Agarwal et al. | |
| 6,746,916 B2 | 6/2004 | Agarwal et al. | |
| 6,753,618 B2 | 6/2004 | Basceri et al. | 257/915 |
| 6,777,739 B2 | 8/2004 | Agarwal et al. | |
| 6,780,728 B2 | 8/2004 | Tran | |
| 6,780,766 B2 | 8/2004 | Basceri et al. | |
| 6,844,131 B2 | 1/2005 | Oberlander et al. | |
| 6,900,497 B2 | 5/2005 | Agarwal et al. | |
| 2001/0006759 A1 | 7/2001 | Shipley, Jr. et al. | |
| 2002/0076879 A1 | 6/2002 | Lee et al. | |
| 2002/0196651 A1 | 12/2002 | Weis | |
| 2003/0013272 A1 | 1/2003 | Hong et al. | |
| 2003/0045060 A1 | 3/2003 | Ahn et al. | 438/287 |
| 2003/0045078 A1 | 3/2003 | Ahn et al. | 438/585 |
| 2003/0205729 A1 | 11/2003 | Basceri et al. | 257/200 |
| 2003/0213987 A1 | 11/2003 | Basceri et al. | 257/296 |
| 2003/0219942 A1 | 11/2003 | Choi et al. | 438/253 |
| 2004/0043228 A1 | 3/2004 | Derderian et al. | 428/446 |
| 2004/0046197 A1 | 3/2004 | Basceri et al. | 257/296 |
| 2004/0245559 A1 | 12/2004 | Pontoh et al. | 257/306 |
| 2004/0245560 A1 | 12/2004 | Pontoh et al. | 257/309 |

OTHER PUBLICATIONS

Chang et al., Silicon surface treatments in advanced MOS gate processing, Microelectronic Engineering , (2004), pp. 130-135.

Lemberger et al., Electrical characterization and reliability aspects of zirconium silicate films obtained from novel MOCVD precursors, Microelectronic Engineering (2004), pp. 315-320.

Lu et al., Effects of the TaN, interface layer on doped tantalum oxide high-$k$ films, VACUUM (2004), pp. 1-9.

U.S. Appl. No. 10/932,218, filed Sep. 1, 2004, Basceri et al.

Robertson et al., Atomic structure, band offsets, growth and defects at high-$K$ oxide:Si enterfaces, Microelectronic Engineering (2004) pp. 112-120.

Singh et al., High and Low Dielectric Constant Materials, The Electrochemical Society *Interface*, Summer 1999, pp. 26-30.

ABSTRACT: Basceri et al., Atomic Layer Deposition for Nanoscale CU Metalization, 10 pages (pre-Apr. 2004).

En et al., Plasma immersion Ion Implantation reactor design considerations for oxide charging, 85 Surface and Coatings Technology 64-69 (1966).

Ku et al., The Application of Ion Beam Mixing, Doped Silicide, and Rapid Thermal Processing of Self-Aligned Silicide Technology, 137 J. Electrochem. Soc. No. 2, pp. 728-740 (Feb. 1990).

ABSTRACT: How to Eliminate Voiding in Porous-Low-k Dielectrics and The Mechanism of Void Formation; Lin et al.; 4 pages.

COB Stack DRAM Cell Technology beyond 100 nm Technology Node; Yongjik Park & Kinam Kim; pp. 349.1-349.3.

Rubin et al., Shallow-Junction Diode Formation by implantation of Arsenic and Boron Through Titanium-Silicide Films and . . . , 17 IEEE Transactions on Electron Devices, No. 1, pp. 183-190 (Jan. 1990).

U.S. Appl. No. 10/609,311, filed Jun. 2003, Yates.
U.S. Appl. No. 10/655,997, filed Sep. 2003, Daley.
U.S. Appl. No. 10/689,958, filed Oct. 2003, Basceri.
U.S. Appl. No. 10/882,118, filed Apr. 2004, Sandhu et al.
U.S. Appl. No. 10/879,367, filed Jun. 2004, Blalock et al.

* cited by examiner

_Fig 1_

_Fig 2_

_Fig 3_

METHODS OF FORMING CONDUCTIVE METAL SILICIDES BY REACTION OF METAL WITH SILICON

TECHNICAL FIELD

This invention relates to methods of forming conductive metal suicides by reaction of metal with silicon.

BACKGROUND OF THE INVENTION

Integrated circuits typically use various combinations of insulative materials, conductive materials, and semiconductive materials (including conductively doped semiconductive materials). One type of conductive material which is utilized is elemental metals. In the context of this document, an "elemental metal" is defined to mean any one or more metal element(s) in element form, including any alloy of two or more metal elements. In many instances, it is desired to form a metal into electrical connection with a crystalline silicon substrate, for example conductively doped crystalline silicon. However, the physical contact of an elemental metal with a crystalline silicon substrate inherently creates undesired excessive electrical resistance between the two materials.

One common way of reducing this resistance is to form an interfacing suicide region at the junction or interface of the metal with the silicon. Thereby, a silicon-silicide-metal interfacing electrical connection is formed. One manner of forming the silicide is merely by heating the substrate with the two contacting layers to a suitable temperature for a sufficient period of time, typically in an inert atmosphere, to cause a reaction of metal and silicon to form the metal silicide. Alternately or in addition thereto, the deposition conditions for the metal material deposited over the silicon can be effectively high to impart a reaction of the depositing metal with the underlying silicon in situ during deposition. Regardless, the silicide which forms results from reaction of the metal with the underlying silicon substrate. The reaction is typically self-limiting such that further processing or exposure to temperature at some point stops resulting in silicide formation.

Integrated circuitry fabrication continues to strive to make ever denser and smaller electronic devices of the circuitry. One place where silicide contact structures are utilized is in the electrical connection of source/drain diffusion regions of field effect transistors with overlying conductive metal lines. As the device components get smaller and denser, it is highly desirable to precisely control the amount of silicide which is formed in such contacts, as well as in other devices where silicide interfaces between metal and silicon are desired to be formed. For example in some instances in present-generation processing, it is desirable to fabricate the silicide regions over the substrates to have thicknesses of from 50 Angstroms to 100 Angstroms. Further, it is expected that the thickness of silicide regions in later-generation processing will fall below 50 Angstroms. Regardless, the variation in thickness of silicide regions formed over a substrate using typical prior art processing has been found to be anywhere from 20 Angstroms to 25 Angstroms across the substrate. This variability is undesirable and constitutes a 20% to 25% thickness variation for desired 100 Angstroms thick silicide regions, and a 40% to 50% variation in thickness for desired 50 Angstroms thick suicide regions. It would be desirable to develop methods which enable tighter thickness control of silicide regions which are formed across a substrate, and particularly where the silicide regions being formed have thicknesses that are no greater than 100 Angstroms where the above problem particularly manifests.

While the invention was motivated in addressing the above described issues, it is in no way so limited. The invention is only limited by the accompanying claims as literally worded, without interpretative or other limiting reference to the specification, and in accordance with the doctrine of equivalents.

SUMMARY

The invention includes methods of forming conductive metal suicides by reaction of metal with silicon. In one implementation, such a method includes providing a semiconductor substrate comprising an exposed elemental silicon containing surface. At least one of a crystalline form TiN, WN, elemental form W, or SiC comprising layer is deposited onto the exposed elemental silicon containing surface to a thickness no greater than 50 Angstroms. Such layer is exposed to plasma and a conductive reaction layer including at least one of an elemental metal or metal rich silicide is deposited onto the plasma exposed layer. At least one of metal of the conductive reaction layer or elemental silicon of the substrate is diffused along columnar grain boundaries of the crystalline form layer effective to cause a reaction of metal of the conductive reaction layer with elemental silicon of the substrate to form a conductive metal silicide comprising contact region electrically connecting the conductive reaction layer with the substrate.

Other aspects and implementations are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
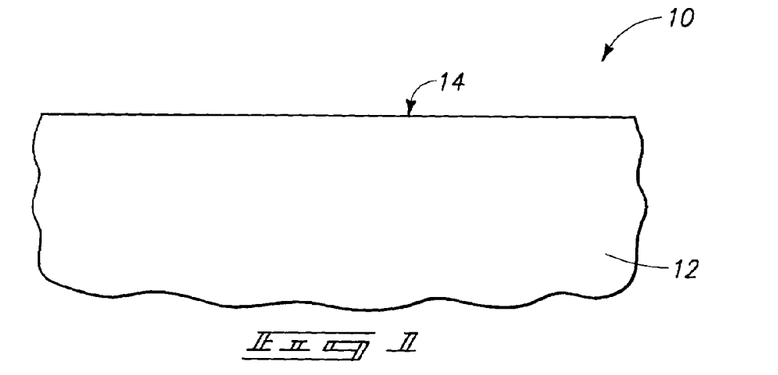
FIG. 1 is a diagrammatic sectional view of a semiconductor wafer fragment in process in accordance with an aspect of the invention.

Exemplary preferred methods of forming a conductive metal silicide by reaction of metal with silicon are described with reference to FIGS. 1–9. Referring initially to FIG. 1, a substrate fragment is indicated generally with reference numeral 10, and comprises a semiconductor substrate 12. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Accordingly, semiconductor substrate 12 might comprise various structures and/or composites and/or mixtures of insulative, conductive and semiconductive materials. Regardless in the context of the invention, semiconductor substrate 12 comprises some exposed elemental silicon containing surface 14. Such might be a substantially global surface across the entirety of the substrate being processed, or one or more isolated regions of exposed elemental silicon. For example, and by way of example only, an exposed silicon surface might constitute the outer surface of a conductive diffusion region formed of conductively doped monocrystalline or polycrystalline silicon exposed through a contact opening formed in an insulative material layer or layers. Regardless, in one aspect, exposed elemental silicon containing surface 14 comprises monocrystalline silicon (including epitaxially grown silicon) and/or polycrystalline silicon. Exposed elemental silicon containing surface also or alternately might comprise silicon from a silicon-rich silicon compound.

Figure 2:
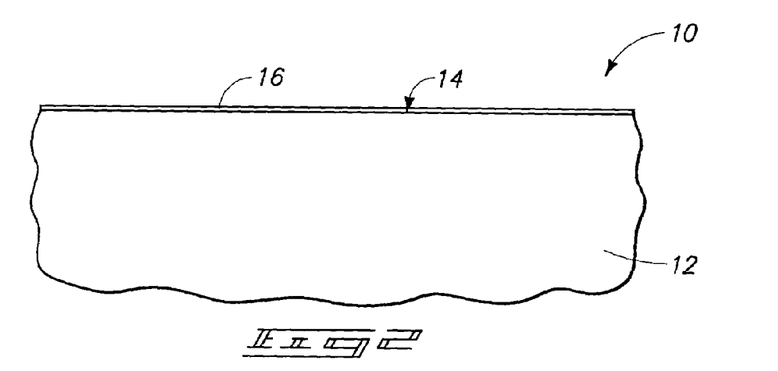
FIG. 2 is a view of the FIG. 1 fragment at a processing step subsequent to that shown by FIG. 1.

Referring to FIG. 2, a layer 16, comprising at least one of a crystalline form TiN, WN, elemental form W or SiC, is deposited onto exposed elemental silicon containing surface 14 to a thickness no greater than 50 Angstroms. Accordingly, crystalline form layer 16 might comprise any one or combination of TiN, WN, elemental form W or SiC. Preferred manners of depositing crystalline form layer 16 are one or more of chemical vapor deposition (CVD) and atomic layer deposition (ALD). However, any method of depositing, whether existing or yet-to-be developed, is contemplated, including for example physical vapor deposition or electroplating. By way of examples only, an exemplary preferred method of depositing crystalline form layer 16 is by CVD, for example using $NH_3$ and $TiCl_4$ to deposit TiN; using $WF_6$ to deposit elemental form W; using $WF_6$ and $NH_3$ to deposit WN; and using a silane and an alkane or alkene to deposit SiC. An exemplary preferred substrate temperature during the deposition is from 600° C. to 700° C. An exemplary preferred pressure range is from 1 Torr to 10 Torr, and preferably plasma is not utilized. Flow rates of the respective precursor gases and materials are not material to the invention, with exemplary preferred ranges being from 100 sccm to 1000 sccm and/or from 10 mg/min. to 500 mg/min. The preferred CVD could be continuous or pulsed, and of course use any desired combination of reactive, carrier, inert, etc. gases.

Regardless, exposed elemental silicon containing surface 14 is preferably subjected to an HF dip prior to the depositing of layer 16 thereover. Further, crystalline form layer 16 is preferably of a thickness no less than 5 Angstroms. Further preferably, crystalline form layer 16 is of a thickness from 5 Angstroms to 25 Angstroms, more preferably from 10 Angstroms to 25 Angstroms, and even more preferably from 15 Angstroms to 25 Angstroms. In another exemplary preferred embodiment, crystalline form layer 16 is of a thickness of from 5 Angstroms to 10 Angstroms.

ALD is also a preferred method of deposition. ALD typically involves formation of successive atomic layers on a substrate. Such layers may comprise, for example, epitaxial, polycrystalline, and/or amorphous material. Described in summary, ALD includes exposing an initial substrate to a first chemical species to accomplish chemisorbtion of the species onto the substrate. Theoretically, the chemisorbtion forms a monolayer that is uniformly one atom or molecule thick on the entire exposed initial substrate. In other words, a saturated monolayer is preferably formed. Practically, chemisorbtion might not occur on all portions or completely over the desired substrate surfaces. Nevertheless, such an imperfect monolayer is still considered a monolayer. In many applications, merely a substantially saturated monolayer may be suitable. A substantially saturated monolayer is one that will still yield a deposited layer exhibiting the quality and/or properties desired for such layer.

The first species is purged from over the substrate and a second chemical species is provided to chemisorb onto the first monolayer of the first species. The second species is then purged and the steps are repeated with exposure of the second species monolayer to the first species. In some cases, the two monolayers may be of the same species. Also, a third species or more may be successively chemisorbed and purged just as described for the first and second species. Further, one or more of the first, second and third species can be mixed with inert gas to speed up pressure saturation within a reaction chamber.

Purging may involve a variety of techniques including, but not limited to, contacting the substrate and/or monolayer with a carrier gas and/or lowering pressure to below the deposition pressure to reduce the concentration of a species contacting the substrate and/or chemisorbed species. Examples of carrier gases include $N_2$, Ar, He, Ne, Kr, Xe, etc. Purging may instead include contacting the substrate and/or monolayer with any substance that allows chemisorption byproducts to desorb and reduces the concentration of a species preparatory to introducing another species. A suitable amount of purging can be determined experimentally as known to those skilled in the art. Purging time may be successively reduced to a purge time that yields an increase in film growth rate. The increase in film growth rate might be an indication of a change to a non-ALD process regime and may be used to establish a purge time limit.

ALD is often described as a self-limiting process in that a finite number of sites exist on a substrate to which the first species may form chemical bonds. The second species might only bond to the first species and thus may also be self-limiting. Once all of the finite number of sites on a substrate are bonded with a first species, the first species will often not bond to other of the first species already bonded with the substrate. However, process conditions can be varied in ALD to promote such bonding and render ALD not self-limiting. Accordingly, ALD may also encompass a species forming other than one monolayer at a time by stacking of a species, forming a layer more than one atom or molecule thick. Further, local chemical reactions can occur during ALD (for instance, an incoming reactant molecule can displace a molecule from an existing surface rather than forming a monolayer over the surface). To the extent that such chemical reactions occur, they are generally confined within the uppermost monolayer of a surface.

Traditional ALD can occur within frequently-used ranges of temperature and pressure and according to established purging criteria to achieve the desired formation of an overall ALD layer one monolayer at a time. Even so, ALD conditions can vary greatly depending on the particular precursors, layer composition, deposition equipment, and other factors according to criteria known by those skilled in the art. Maintaining the traditional conditions of temperature, pressure, and purging minimizes unwanted reactions that may impact monolayer formation and quality of the resulting overall ALD layer. Accordingly, operating outside the traditional temperature and pressure ranges may risk formation of defective monolayers.

Figure 3:
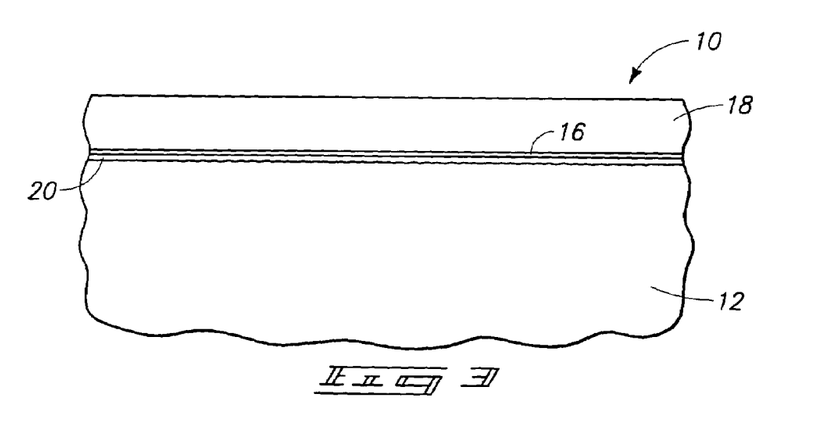
FIG. 3 is a view of the FIG. 1 fragment at a processing step subsequent to that shown by FIG. 2.

Referring to FIG. 3, crystalline form layer 16 has been exposed to plasma and a conductive reaction layer 18 comprising at least one of an elemental metal or metal rich silicide has been deposited onto plasma exposed layer 16. At least one of metal of conductive reaction layer 18 or elemental silicon of substrate 12 is diffused along columnar grain boundaries of crystalline form layer 16 effective to cause a reaction of metal of conductive reaction layer 18 with elemental silicon of substrate 12 to form a conductive metal silicide comprising contact region 20 which electrically connects conductive reaction layer 18 with substrate 12. Conductive metal silicide comprising contact region 20 preferably has a thickness from 5 Angstroms to 100 Angstroms. Conductive reaction layer 18 might be of the same, greater or lesser thickness as that of crystalline form layer 16.

Figure 4:
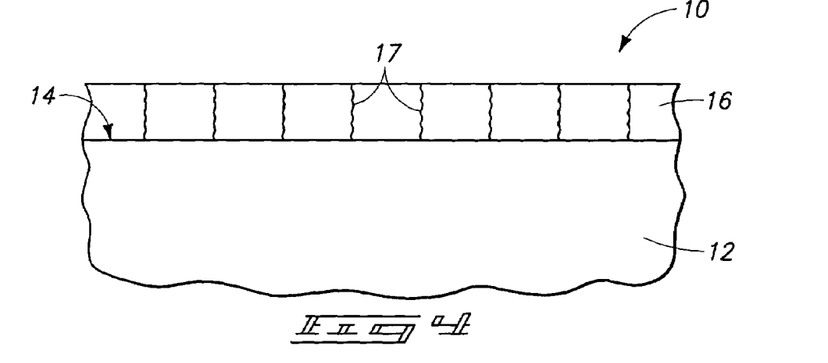
FIG. 4 is enlarged view of a portion of the FIG. 2 fragment.

FIG. 4 diagrammatically depicts an enlarged portion of substrate 10 of FIG. 2. In one preferred embodiment, such depicts crystalline form layer 16 in an as-deposited (or subsequently treated prior to the depositing of layer 18) state which is predominately (everywhere herein meaning greater than 50%) of a columnar grain boundary microstructure. Such is characterized by the diagrammatically depicted exemplary columnar grain boundaries 17 which run substantially perpendicularly to the locally most-proximate surface upon which crystalline form layer 16 is deposited. Alternately, crystalline form layer 16 might have very little, if any, columnar grain boundary microstructure prior to plasma treatment and the deposition of conductive reaction layer 18. Regardless, in one preferred embodiment, the exposing to plasma increases the degree of columnar grain boundary microstructure within crystalline form layer 16 from what it was prior to the exposing. In the context of this document, an increase in degree of columnar grain boundary microstructure means an increase in the number of columnar grain boundaries, and including even where none was initially present. Without being limited to any theory of invention, and regardless of whether the plasma exposure increases the degree of columnar grain boundary microstructure, it is also believed that the plasma exposure may ultimately assist or facilitate the diffusing of metal of conductive reaction layer 18 or elemental silicon of substrate 12 into and along columnar grain boundaries 17, which ultimately facilitates silicide formation in a more controllable and consistent manner.

Figure 5:
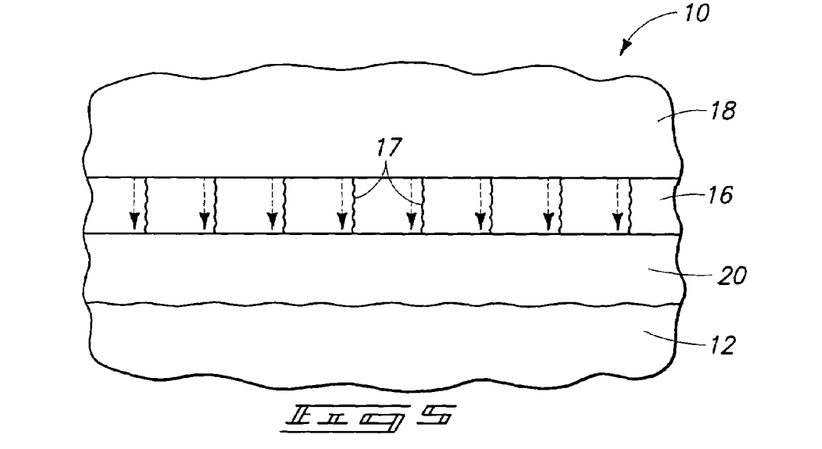
FIG. 5 is enlarged view of a portion of the FIG. 3 fragment.

FIG. 5 diagrammatically depicts an enlarged view of a portion of substrate 3. The vertically downward depicted dashed arrows are intended to exemplify/indicate metal of conductive reaction layer 18 diffusing along columnar grain boundaries 17 of crystalline form layer 16 which has been effective to form conductive metal suicide comprising contact region 20.

Figure 6:
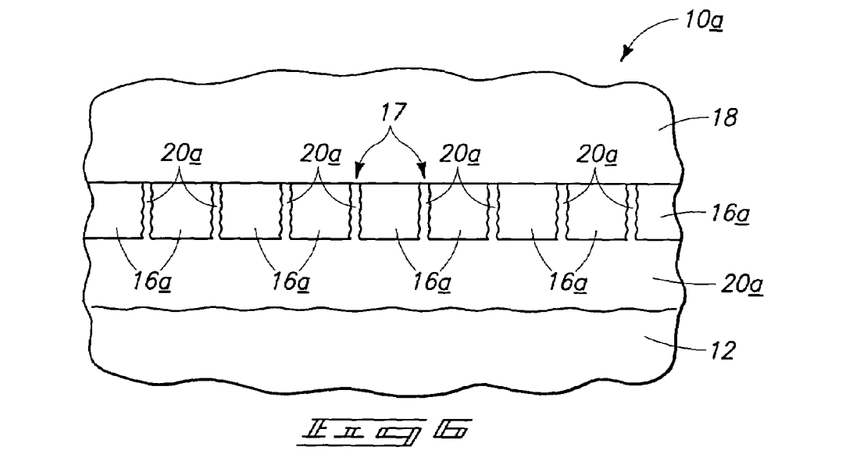
FIG. 6 is an alternate view to that depicted by FIG. 5.

FIG. 6 illustrates an alternate additional exemplary embodiment 10a to that depicted by FIG. 5. Like numerals from the first described embodiment have been utilized where appropriate, with differences being indicated by the suffix "a". FIG. 6 is intended to diagrammatically depict or illustrate an exemplary aspect effect of the diffusion of elemental silicon of substrate 20 along columnar grain boundaries 17 of crystalline form layer 16a. FIG. 6 depicts such silicon diffusing as also being effective to form metal silicide material 20a to be received within crystalline form layer 16a extending along columnar grain boundaries 17. Accordingly in such exemplary embodiment, metal silicide formed by the reaction of substrate material 12 and conductive reaction layer 18 is received both beneath crystalline form layer 16a and therewithin.

Metal silicide formed from reaction layer 18 and substrate material 12 might also form above crystalline form layer 16/16a. Alternately, it is possible that the combination of the exposing, depositing, diffusing and reaction might be effective to substantially break up and/or diffuse crystalline form layer 16 relative to one or both of conductive reaction layer 18 or suicide region 20/20a such that layer 16 may no longer be distinguishable or have the same boundaries as initially deposited.

Regardless, as exemplary preferred embodiments, each of FIGS. 5 and 6 depict the effective diffusing of metal with conductive reaction layer 18 along columnar grain boundaries of crystalline form layer 16/16a as being effective to form the predominate portion of metal silicide 20/20a the result of the reaction to be received beneath crystalline form layer 16/16a. Further in some exemplary preferred embodiments, the stated diffusing and reaction are effective to form all of the metal silicide from the reaction to be received either a) beneath the crystalline form layer (FIG. 5), or b) within the crystalline form layer along the columnar grain boundaries as well as beneath the crystalline form layer (FIG. 6).

FIGS. 3, 5 and 6 depict outer un-reacted portions of conductive reaction layer 18. In one preferred example, the outer portion of conductive reaction layer 18 at least predominately comprises elemental metal, and in another example consists essentially of elemental metal. In one exemplary embodiment, the outer portion of conductive reaction layer 18 at least predominately comprises metal rich silicide, and in another example consists essentially of metal rich silicide. By way of example only, exemplary elemental metals include titanium, nickel, ruthenium, cobalt, tungsten, iridium, molybdenum, and mixtures thereof. Exemplary metal rich suicides include metal suicides of these exemplary metals, including mixtures thereof.

One exemplary preferred and reduction-to-practice material for conductive reaction layer 18 comprises at least one of titanium and titanium rich titanium silicide. Further by way of example only, titanium and titanium rich titanium silicides can be deposited utilizing halides, such as $TiCl_4$. An exemplary preferred technique for depositing elemental titanium utilizes a capacitively coupled, single wafer processor, for example a Centura™ reactor available from Applied Materials of Santa Clara, Calif. Exemplary substrate temperature conditions during deposit of either a titanium or titanium rich metal silicide layer include from 550° C. to 700° C. An exemplary preferred pressure range is from 1 Torr to 10 Torr, with an exemplary RF applied power being from 50 Watts to 500 Watts. An exemplary flow rate of the $TiCl_4$ is from 50 mg/min to 500 mg/min, with an exemplary additional gas flows of Ar and $H_2$ each being from 50 sccm to 500 sccm. If a titanium rich titanium silicide is to be deposited, a suitable silane could also be flowed and/or pulsed to the deposition reactor at volumetric flow rates sufficiently spaced or suitably low to result in excess elemental titanium in the titanium silicide layer being formed.

The above stated exposing of the crystalline form layer to plasma, the depositing of a conductive reaction layer, the diffusing, and the reaction to form a conductive metal silicide comprising contact region can occur separately or in various combinations. For example where a conductive reaction layer depositing is by a plasma deposition, such act of depositing with plasma can constitute some or all of the crystalline form layer exposing to plasma. Accordingly in such example, at least some of such layer exposing to plasma occurs during the depositing of the conductive reaction layer. If there is no plasma exposure of the crystalline form layer prior to a plasma deposition of the conductive reaction layer, then the exposing would only occur during a plasma deposition of the conductive reaction layer.

Figure 7:
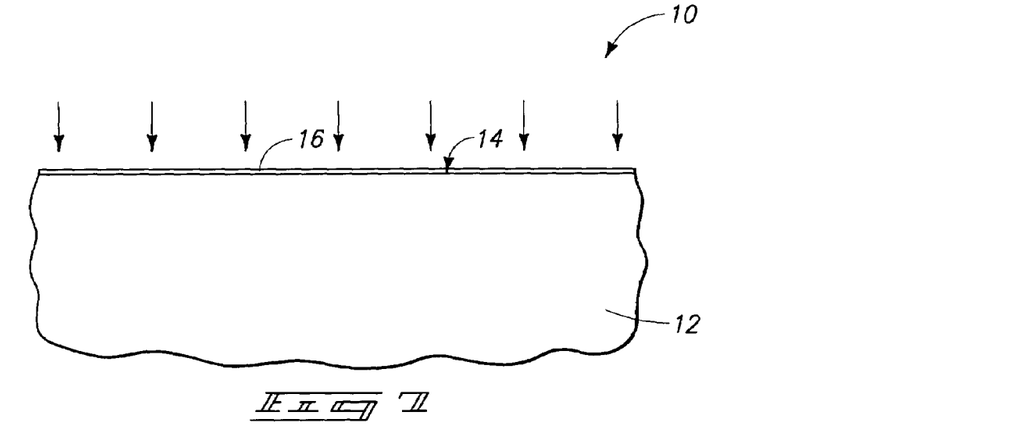
FIG. 7 is a view of the FIG. 1 fragment at a processing step subsequent to that shown by FIG. 2.

FIG. 7 diagrammatically depicts by the downwardly directed arrows crystalline form layer 16 being exposed to plasma prior to and separate of the depositing of conductive reaction layer 18 as depicted by FIG. 3. As stated above, some plasma exposure of layer 16 is contemplated in accordance with the invention. Such plasma exposure might all occur during the deposition of the conductive reaction layer, all of such exposing prior to and separate of the deposition of the conductive reaction layer, or both before and during deposition of the conductive reaction layer.

Figure 8:
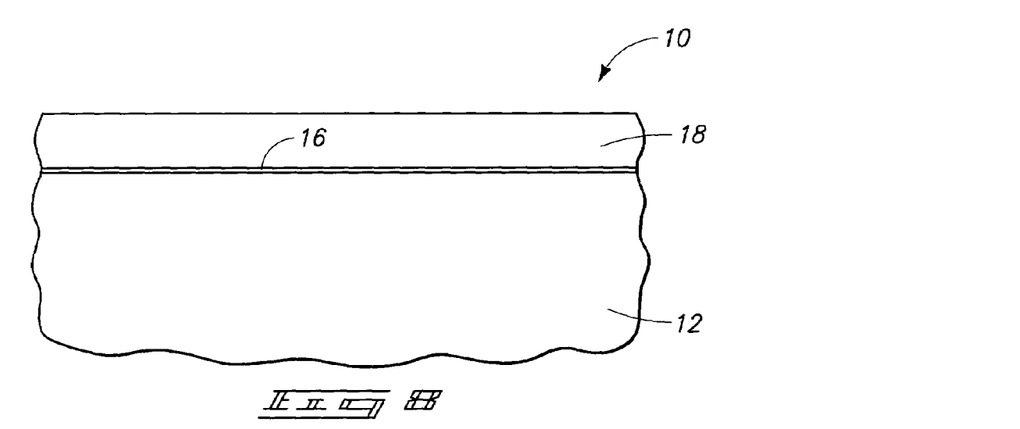
FIG. 8 is a view of the FIG. 1 fragment at a processing step subsequent to that shown by FIG. 2.

Further regarding diffusion and reaction of metal of the conductive reaction layer with elemental silicon of the substrate to form a conductive metal silicide comprising contact region, such diffusing and reaction might occur during the conductive reaction layer depositing, after the depositing, or both during and after the depositing. By way of example only, FIG. 8 depicts a conductive reaction layer 18 deposited over crystalline form layer 16 in a manner wherein negligible if any diffusion and reaction to form a conductive metal silicide comprising contact region occurs. Such might result if deposition of layer 18 were conducted at suitably low temperatures to preclude appreciable diffusion and reaction of metal of layer 18 with silicon of substrate 12, with or without plasma. If so and regardless, diffusion and a silicidation reaction between metal of layer 18 and silicon of substrate 12 could be achieved by exposure of the substrate to a suitable temperature, for example from 400° C. to 700° C. for an exemplary time period of from 30 seconds to 5 minutes to, for example, produce the structures of FIGS. 3, 5 and 6.

Processing as described in the above exemplary preferred embodiments produces certain unexpected advantages and results. However, such advantages or results do not constitute part of the invention unless literally appearing in a particular claim under analysis. In one preferred implementation, the exposing, depositing, diffusing and reaction result in better control (less variation) in the thickness of the metal silicide formed by the reaction. Accordingly in one implementation, the exposing, depositing, diffusing, and reaction are effective to form all conductive metal silicide formed over the substrate by the reaction to have no more than 10% thickness variation as determined as the percentage of the thickness portion of the conductive metal silicide formed by the reacting. In another preferred implementation, such thickness variation is from 1% to 3%, and in another preferred embodiment to have no more than 1% of such thickness variation. It is expected that where a thickest deposited portion of a metal suicide formed by the reacting is 50 Angstroms, the thickness variation across the substrate might not exceed 0.5 Angstrom of the metal silicide formed by the reacting.

Figure 9:
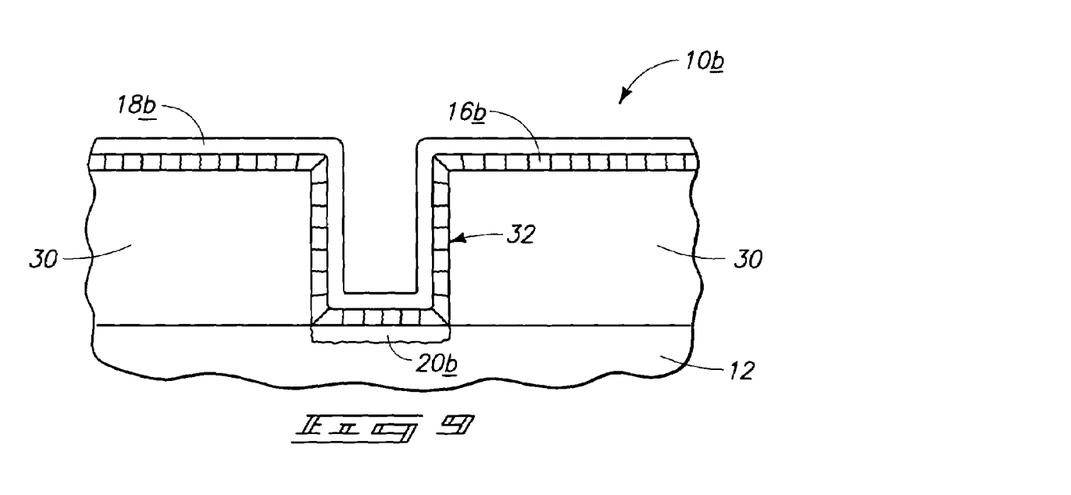
FIG. 9 is a diagrammatic sectional view of an alternate embodiment semiconductor wafer fragment in process in accordance with an aspect of the invention.

By way of example only, FIG. 9 depicts an alternate exemplary embodiment substrate fragment 10b. Like numerals form the first described embodiment are utilized where appropriate, with differences being indicated with the suffix "b" or with different numerals. FIG. 9 depicts insulative material 30, for example comprising borophosphosilicate glass and undoped $SiO_2$, having been deposited over substrate 12. A contact opening 32 has been formed therethrough effective to expose some elemental silicon containing surface of substrate 12. Crystalline form layer 16b, comprising at least one of crystalline form TiN, WN, elemental form W, or SiC, has been deposited to a thickness no greater than 50 Angstroms. Processing has occurred in accordance with the broadest aspects above, including any of the various preferred attributes, effective to form conductive metal silicide comprising contact region 20b which electrically connects conductive reaction layer 18b with substrate 12. Further processing could occur, of course, including the forming of additional layers or the removing of the depicted layers without departing form the spirit and scope of the invention.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a conductive metal silicide by reaction of metal with silicon, comprising:
   providing a semiconductor substrate comprising an exposed elemental silicon-containing surface;
   depositing a crystalline form layer comprising at least one of TiN, WN, elemental form W, or SiC onto the exposed elemental silicon-containing surface to a thickness no greater than 50 Angstroms;
   exposing the crystalline form layer of thickness no greater than 50 Angstroms to plasma and depositing a conductive reaction layer comprising at least one of an elemental metal or metal rich silicide onto the plasma exposed layer; and
   diffusing at least one of metal of the conductive reaction layer or elemental silicon of the substrate along columnar grain boundaries of the crystalline form layer effective to cause a reaction of metal of the conductive reaction layer with elemental silicon of the substrate to form a conductive metal silicide-comprising contact region electrically connecting the conductive reaction layer with the substrate.

2. The method of claim 1 wherein the exposing increases degree of columnar grain boundary microstructure within the crystalline form layer from what it was prior to the exposing.

3. The method of claim 1 wherein the crystalline form layer prior to the exposing comprises a predominately columnar grain boundary microstructure.

4. The method of claim 3 wherein the exposing increases degree of columnar grain boundary microstructure within the crystalline form layer from what it was prior to the exposing.

5. The method of claim 1 wherein the metal of the conductive reaction layer diffuses along the columnar grain boundaries of the crystalline form layer.

6. The method of claim 1 wherein the metal of the conductive reaction layer diffuses along the columnar grain boundaries of the crystalline form layer effective to form a predominate portion of the metal silicide from the reaction to be received beneath the crystalline form layer.

7. The method of claim 1 wherein the elemental silicon of the substrate diffuses along the columnar grain boundaries of the crystalline form layer.

8. The method of claim 1 wherein the diffusing and reaction occur during the depositing.

9. The method of claim 1 wherein the diffusing and reaction occur after the depositing.

10. The method of claim 9 wherein the diffusing and reaction do not occur during the depositing.

11. The method of claim 1 wherein the crystalline form layer is of a thickness no less than 5 Angstroms.

12. The method of claim 1 wherein the crystalline form layer is of a thickness from 5 Angstroms to 25 Angstroms.

13. The method of claim 1 wherein the crystalline form layer is of a thickness from 10 Angstroms to 25 Angstroms.

14. The method of claim 1 wherein the crystalline form layer is of a thickness from 15 Angstroms to 25 Angstroms.

15. The method of claim 1 wherein the crystalline form layer is of a thickness from 5 Angstroms to 10 Angstroms.

16. The method of claim 1 wherein the crystalline form layer comprises TiN.

17. The method of claim 1 wherein the crystalline form layer comprises WN.

18. The method of claim 1 wherein the crystalline form layer comprises elemental form W.

19. The method of claim 1 wherein the crystalline form layer comprises elemental form SiC.

20. The method of claim 1 wherein the depositing comprises CVD.

21. The method of claim 1 wherein the depositing comprises ALD.

22. The method of claim 1 wherein the depositing comprises PVD.

23. The method of claim 1 wherein the depositing comprises electroplating.

24. The method of claim 1 wherein the exposed elemental silicon-containing surface comprises polycrystalline silicon.

25. The method of claim 1 wherein the exposed elemental silicon-containing surface comprises monocrystalline silicon.

26. The method of claim 25 wherein the monocrystalline silicon-containing epitaxially grown silicon.

27. The method of claim 1 wherein the exposing occurs during the depositing.

28. The method of claim 1 wherein the exposing only occurs during the depositing.

29. The method of claim 1 wherein at least some of the exposing occurs prior to and separate of the depositing.

30. The method of claim 29 wherein all of the exposing occurs prior to and separate of the depositing.

31. The method of claim 1 wherein the conductive reaction layer has an outer portion that at least predominately comprises elemental metal.

32. The method of claim 31 wherein the conductive reaction layer outer portion consists essentially of elemental metal.

33. The method of claim 1 wherein the conductive reaction layer has an outer portion that at least predominately comprises metal rich silicide.

34. The method of claim 33 wherein the conductive reaction layer outer portion consists essentially of metal rich silicide.

35. The method of claim 1 wherein the exposing, diffusing and the reaction occur during the depositing.

36. The method of claim 1 wherein the conductive metal silicide formed by the diffusing and reaction has a thickness from 5 Angstroms to 100 Angstroms.

37. The method of claim 1 wherein the exposing, depositing, diffusing, and reaction are effective to form all conductive metal silicide formed over the substrate by the reaction to have no more than 10% thickness variation as determined of a thickest portion of said conductive metal silicide formed by the reaction.

38. The method of claim 1 wherein the exposing, depositing, diffusing and reaction are effective to form all conductive metal silicide formed over the substrate by the reaction to have no more than 1% thickness variation as determined of a thickest portion of said conductive metal silicide formed by the reaction.

39. The method of claim 1 wherein the exposing, depositing, diffusing and reaction are effective to form all conductive metal silicide formed over the substrate by the reaction to have from 1% to 3% thickness variation as determined of a thickest portion of said conductive metal silicide formed by the reaction.

40. The method of claim 1 wherein the exposed elemental silicon-containing surface is received within a contact opening formed within an insulative layer.

41. A method of forming a conductive metal silicide by reaction of metal with silicon, comprising:
   providing a semiconductor substrate comprising an exposed elemental silicon-containing surface;
   depositing a crystalline form layer comprising at least one of TiN, WN, elemental form W, or SiC onto the exposed elemental silicon-containing surface to a thickness no greater than 50 Angstroms;
   exposing the crystalline form layer of thickness no greater than 50 Angstroms to plasma and depositing a conductive reaction layer comprising at least one of an elemental metal or metal rich silicide onto the plasma exposed layer; and
   diffusing at least metal of the conductive reaction layer along columnar grain boundaries of the crystalline form layer effective to cause a reaction of metal of the conductive reaction layer with elemental silicon of the substrate to form conductive metal silicide electrically connecting the conductive reaction layer with the substrate, the diffusing and reaction being effective to form a predominate portion of the metal silicide from the reaction to be received beneath the crystalline form layer.

42. The method of claim 41 wherein the diffusing and reaction are effective to form all of the metal silicide from the reaction to be received either a) beneath the crystalline form layer, or b) within the crystalline form layer along the columnar grain boundaries and beneath the crystalline form layer.

43. The method of claim 41 wherein the diffusing and reaction occur during the depositing.

44. The method of claim 41 wherein the diffusing and reaction occur after the depositing.

45. The method of claim 44 wherein the diffusing and reaction do not occur during the depositing.

46. The method of claim 41 wherein the crystalline form layer is of a thickness no less than 5 Angstroms.

47. The method of claim 41 wherein the crystalline form layer is of a thickness from 5 Angstroms to 25 Angstroms.

48. The method of claim 41 wherein the crystalline form layer is of a thickness from 10 Angstroms to 25 Angstroms.

49. The method of claim 41 wherein the crystalline form layer is of a thickness from 15 Angstroms to 25 Angstroms.

50. The method of claim 41 wherein the crystalline form layer is of a thickness from 5 Angstroms to 10 Angstroms.

51. The method of claim 41 wherein the crystalline form layer comprises TiN.

52. The method of claim 41 wherein the crystalline form layer comprises WN.

53. The method of claim 41 wherein the crystalline form layer comprises elemental form W.

54. The method of claim 41 wherein the crystalline form layer comprises elemental form SiC.

55. The method of claim 41 wherein the exposing occurs during the depositing.

56. The method of claim 41 wherein the exposing only occurs during the depositing.

57. The method of claim 41 wherein at least some of the exposing occurs prior to and separate of the depositing.

58. The method of claim 57 wherein all of the exposing occurs prior to and separate of the depositing.

59. The method of claim 41 wherein the conductive reaction layer has an outer portion that at least predominately comprises elemental metal.

60. The method of claim 59 wherein the conductive reaction layer outer portion consists essentially of elemental metal.

61. The method of claim 41 wherein the conductive reaction layer has an outer portion that at least predominately comprises metal rich silicide.

62. The method of claim 61 wherein the conductive reaction layer outer portion consists essentially of metal rich silicide.

63. The method of claim 41 wherein the exposing, diffusing and the reaction occur during the depositing.

64. The method of claim 41 wherein the conductive metal silicide formed by the diffusing and reaction has a thickness from 5 Angstroms to 100 Angstroms.

65. The method of claim 41 wherein the exposing, depositing, diffusing, and reaction are effective to form all conductive metal silicide formed over the substrate by the reaction to have no more than 10% thickness variation as determined of a thickest portion of said conductive metal silicide formed by the reaction.

66. The method of claim 41 wherein the exposing, depositing, diffusing and reaction are effective to form all conductive metal silicide formed over the substrate by the reaction to have no more than 1% thickness variation as determined of a thickest portion of said conductive metal silicide formed by the reaction.

67. The method of claim 41 wherein the exposing, depositing, diffusing and reaction are effective to form all conductive metal silicide formed over the substrate by the reaction to have from 1% to 3% thickness variation as determined of a thickest portion of said conductive metal silicide formed by the reaction.

68. The method of claim 41 wherein the exposed elemental silicon-containing surface is received within a contact opening formed within an insulative layer.

* * * * *

UNITED STATES PATENT AND TRADEMARK OFFICE
CERTIFICATE OF CORRECTION

PATENT NO. : 6,969,677 B2
APPLICATION NO. : 10/690029
DATED : November 29, 2005
INVENTOR(S) : Derderian et al.

It is certified that error appears in the above-identified patent and that said Letters Patent is hereby corrected as shown below:

Col. 1, line 8 please delete "suicides" after "metal" and insert --silicides--.

Col. 1, line 27, please delete "suicide" after "interfacing" and insert --silicide--.

Col. 1, line 64, please delete "suicide" after "thick" and insert --silicide--.

Col. 2, line 13, please delete "suicides" after "metal" and insert --silicides--.

Col. 5, line 58, please delete "suicide" after "metal" and insert --silicide--.

Col. 6, line 14, please delete "suicide" after "18" and insert --silicide--.

Col. 6, line 41, please delete "suicides include metal suicides" after "rich" and insert --silicides includes metal silicides--.

Col. 7, line 60, please delete "suicide" after "metal" and insert --silicide--.

Col. 7, line 66, please delete "form" after "numerals" and insert --from--.

Col. 8, line 16, please delete "form" after "departing" and insert --from--.

Signed and Sealed this

Twenty-eighth Day of November, 2006

JON W. DUDAS
*Director of the United States Patent and Trademark Office*